United States Patent [19]
Moslehi

[11] Patent Number: 5,525,780
[45] Date of Patent: Jun. 11, 1996

[54] METHOD AND APPARATUS FOR UNIFORM SEMICONDUCTOR MATERIAL PROCESSING USING INDUCTION HEATING WITH A CHUCK MEMBER

[75] Inventor: Mehrdad M. Moslehi, Dallas, Tex.

[73] Assignee: Texas Instruments Incorporated, Dallas, Tex.

[21] Appl. No.: 114,887

[22] Filed: Aug. 31, 1993

[51] Int. Cl.$^6$ .................................................. H05B 6/10
[52] U.S. Cl. .................... 219/618; 219/635; 219/632; 219/652; 118/725; 118/728
[58] Field of Search ........................ 219/618, 634, 219/635, 638, 631, 647, 649, 652, 632; 118/728, 724, 725

[56] References Cited

U.S. PATENT DOCUMENTS

| | | | |
|---|---|---|---|
| 3,911,859 | 10/1975 | Dudko et al. | 118/676 |
| 4,778,559 | 10/1988 | McNeilly | 156/612 |
| 4,798,926 | 1/1989 | Sakai | 219/634 |
| 4,891,335 | 1/1990 | McNeilly | 437/247 |
| 4,956,046 | 9/1990 | McNeilly | 156/613 |
| 5,025,133 | 6/1991 | Tsutahara et al. | 219/462 |
| 5,238,177 | 8/1993 | Nakulski et al. | 228/265 |
| 5,350,902 | 9/1994 | Fox et al. | 219/633 |

Primary Examiner—Philip H. Leung
Attorney, Agent, or Firm—Jacqueline J. Garner; Richard L. Donaldson; William E. Hiller

[57] ABSTRACT

A multipurpose chuck apparatus (100) has a chamber (112) for holding a medium (114). The medium (114) is heated into a high temperature molten state by a radio frequency induction heating coil (130). The medium (114) heats up a semiconductor material (118) through a chuck member (116) that separates the medium (114) from the semiconductor material (118). The heating performed by the radio frequency induction heating coil (130) generates a fluid flow within the medium (114), providing a uniform temperature distribution throughout the medium (114). A magnetic rotation device (121) controls movement of rotating member (128) having a mixing member (122) and rotating fins (184) to ensure complete uniform temperature distribution throughout the medium (114), especially in the vicinity of the chuck member (116). An inlet cooling tube (122) and an outlet cooling tube (124), isolated from the medium (114) provide cooling fluid to the chuck member (116) for temperature control of the semiconductor material (118).

17 Claims, 8 Drawing Sheets

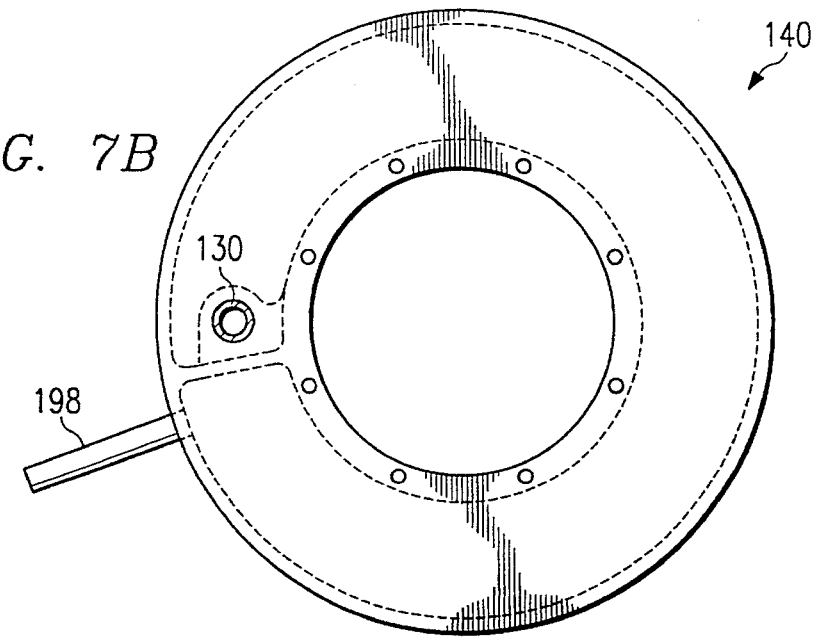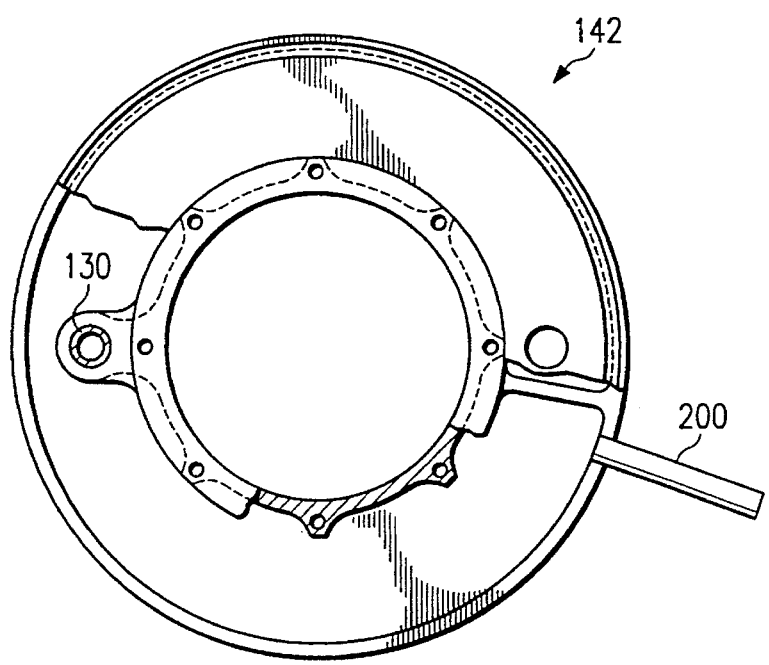

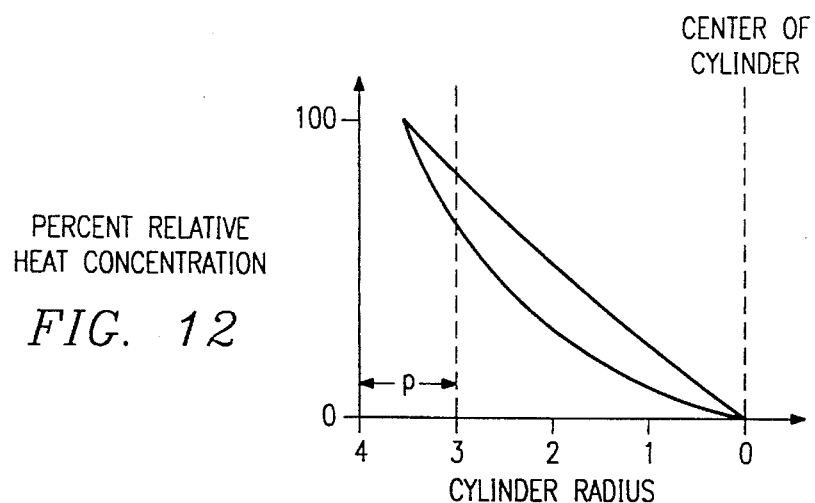
FIG. 12
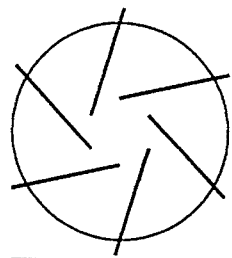
FIG. 13A
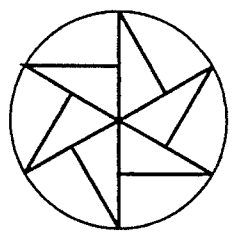
FIG. 13B
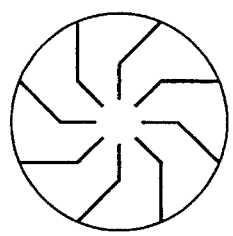
FIG. 13C
FIG. 15
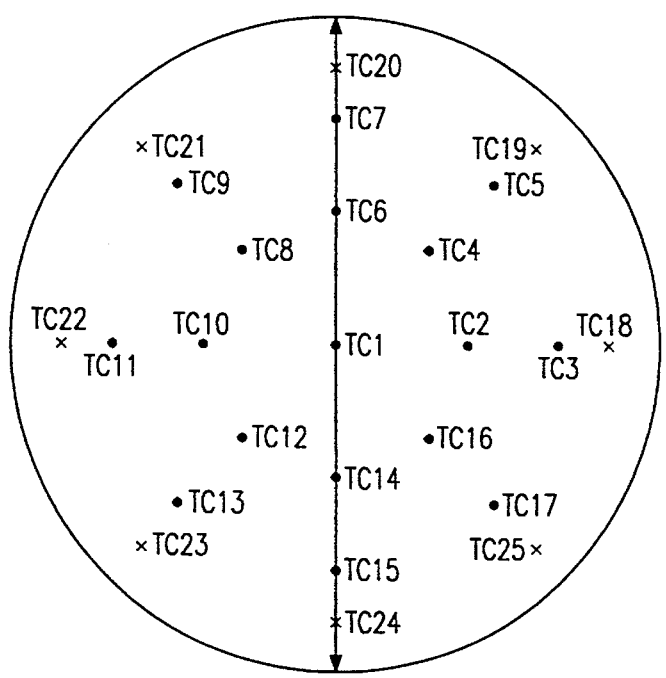

METHOD AND APPARATUS FOR UNIFORM SEMICONDUCTOR MATERIAL PROCESSING USING INDUCTION HEATING WITH A CHUCK MEMBER

TECHNICAL FIELD OF THE INVENTION

This invention relates in general to microelectronics device fabrication processes and more particularly to a method and apparatus for uniform semiconductor material processing in a semiconductor device fabrication equipment.

BACKGROUND OF THE INVENTION

In a variety of semiconductor device fabrication processes, a semiconductor wafer is heated or cooled and the desired fabrication process occurs on the temperature controlled semiconductor substrate. To establish good manufacturing process control, the semiconductor substrate should have a uniform temperature distribution across its entire surface to avoid fabrication process nonuniformities and manufacturing yield loss.

Conventional semiconductor processing reactors, however, are unable to effectively provide a uniform temperature distribution across the entire semiconductor wafer surface, especially at higher processing temperatures. Further, conventional fabrication reactors do not have the flexibility to operate over a wide range from low temperature processing to high temperature processing while still maintaining a uniform temperature distribution across the semiconductor wafer. Higher processing temperatures (e.g., 300° C. to 1000° C.) are required for a variety of device fabrication process steps in silicon technologies. These include chemical-vapor deposition (CVD) processes and plasma-enhanced CVD (PECVD) processes for deposition of various material layers. Other thermally activated high temperature device fabrication processes include thermal anneals for implant activation and dopant redistribution as well as thermal oxidations. On the other hand most plasma etch processes usually require lower substrate temperatures (e.g., −150° C. to 150° C.).

SUMMARY OF THE INVENTION

From the foregoing, it may be appreciated that a need has arisen for a fabrication chuck that maintains a uniform temperature distribution across an entire surface of a material substrate semiconductor wafer. A need has also arisen for a low thermal mass apparatus that provides capabilities for uniform processing of a semiconductor wafer over a wide range of processing temperatures for a variety of applications including plasma etch, depositions, and thermal anneals.

In accordance with the present invention, a method and apparatus for uniform semiconductor processing are provided which substantially eliminate or reduce disadvantages and problems associated with conventional heating and cooling chucks in semiconductor processing systems.

The present invention includes a chamber for holding a medium. The chamber is enclosed at one end by a chuck member that separates the medium from a semiconductor wafer within a process environment outside the chamber and in contact with the chuck member. A radio-frequency induction heating coil surrounds the chamber and transforms the medium into a high temperature molten fluid state. The molten medium uniformly heats the semiconductor material through the chuck member for thermally activated fabrication processes.

The present invention provides various technical advantages over conventional semiconductor processing chucks. For example, one technical advantage is in providing a uniform temperature distribution across the semiconductor wafer. Another technical advantage is to provide capabilities for uniform high temperature and low temperature semiconductor processing over a wide range of processing temperatures. Still another technical advantage is in controlling the temperature of the semiconductor material through rapid applications of desired heating and cooling resulting in relatively fast heat-up and cool-down rates for rapid wafer temperature control and processing. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIGS. 7A–B illustrate cross-sectional and plan views of the upper water cooling module of a multipurpose chuck apparatus;

FIGS. 8A–B illustrate cross-sectional and plan views of the lower water cooling module of a multipurpose chuck apparatus;

FIG. 12 illustrates a graph depicting a heat concentration percentage within the chamber;

FIGS. 13A–C illustrate possible configurations of rotating fins within the chamber;

FIG. 15 illustrates possible placements of thermocouple devices within a chuck member of the multipurpose chuck apparatus.

DETAILED DESCRIPTION OF THE INVENTION

Figure 1:
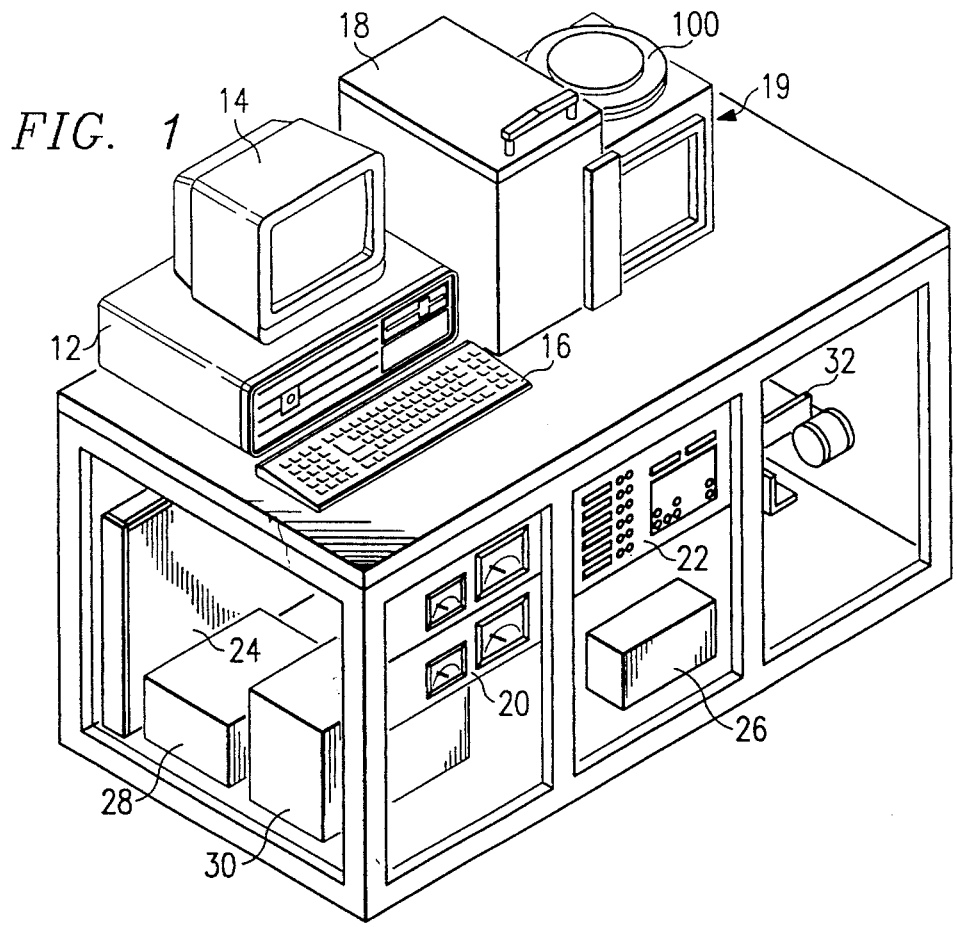
FIG. 1 illustrates a schematic general view of an advanced vacuum processor (AVP) system.

FIG. 1 is a simplified diagram of an advanced vacuum processor (AVP) system 10. AVP system 10 includes a computer 12 with a display monitor 14 and a keyboard 16. Semiconductor wafers are placed in a load lock chamber 18 for fabrication in a process chamber 19. A multipurpose chuck apparatus 100 is installed above and within process chamber 19. AVP system 10 also includes control panels 20 and 22, backplane 24, and power distribution box 26. Gas injected into process chamber 19 comes from a gas box 28. Circuitry for AVP system 10 is placed in a card cage 30. Throttle control for AVP system 10 is performed at throttle valve 32. AVP system 10 performs single wafer fabrication processes.

Figure 2:
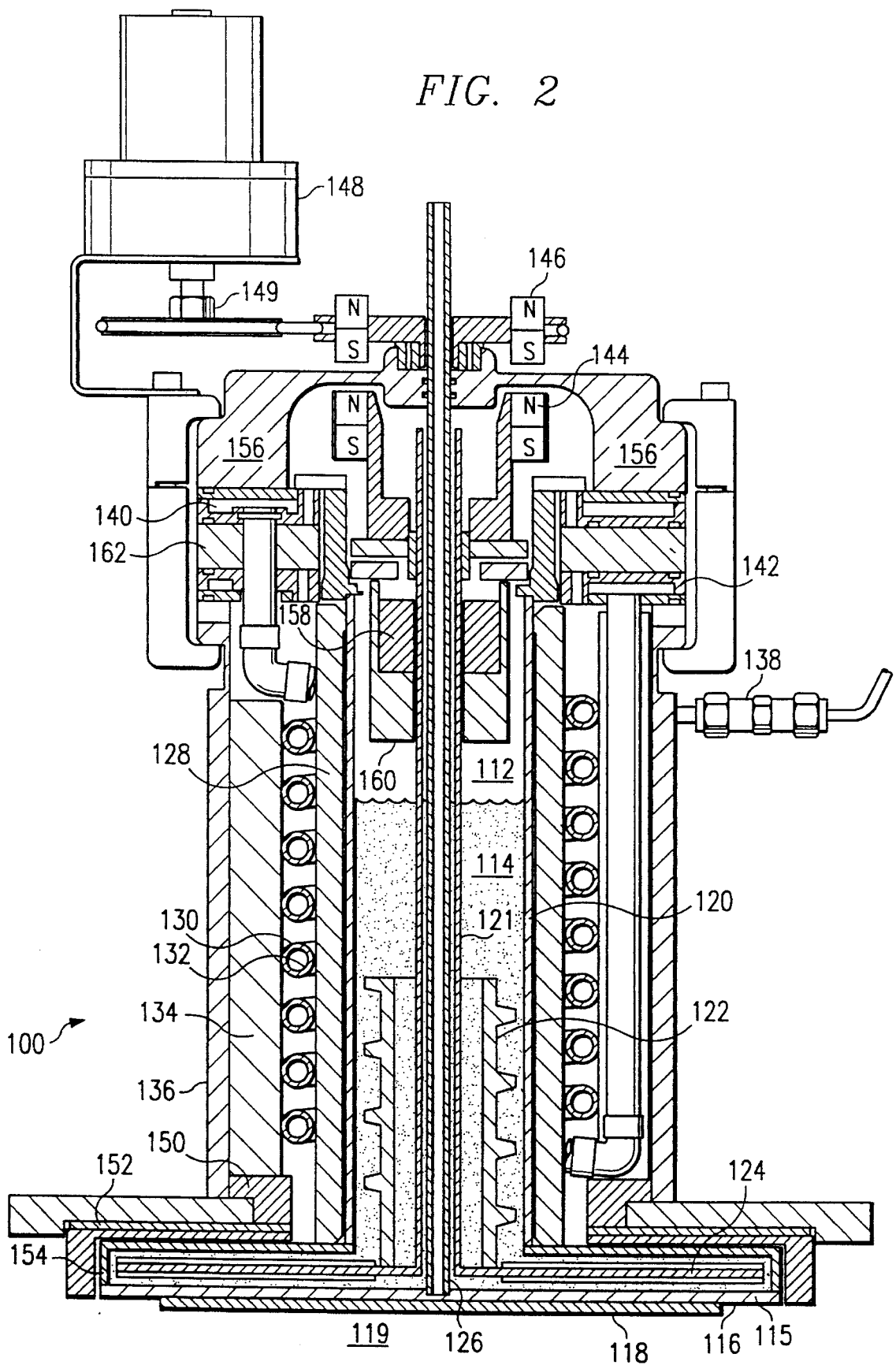
FIG. 2 illustrates a sectional diagram of a multipurpose chuck apparatus.

FIG. 2 is a sectional diagram of multipurpose chuck apparatus 100 for use in semiconductor fabrication equipment such as AVP system 10. Multipurpose chuck apparatus 100 includes a chamber 112 filled with a medium 114. Medium 114 lies in contact with a chuck member 115 having a chuck plate 116 that isolates medium 114 from a semiconductor material 118 within a process chamber 119 and in contact with chuck plate 116. Chamber 112 is formed within a melt chamber wall 120. A mixing member assembly 121, having a stirring cylinder 122 and stirring disks 124, lies within chamber 112 such that mixing member assembly 121 does not come in contact with melt chamber wall 120 or chuck plate 116. A center tube 126 lies completely within mixing member assembly 121 and connects to chuck plate 116. Multipurpose chuck apparatus 100 also includes an inner insulating jacket 128 that separates chamber 112 and melt chamber wall 120 from a tubing 130 that contains a radio frequency (RF) induction heating coil 132. An outer insulating jacket 134 surrounds tubing 130 and is enclosed by an outer housing 136. Outer housing 136 may be fluid cooled through an inlet 138.

Tubing 130 receives fluid for cooling RF induction heating coil 132 from an upper fluid cooling module 140 and outputs fluid through lower fluid cooling module 142. Mixing member assembly 121 connects to an inner magnetic assembly 144 and rotates on bearings in response to an outer magnetic assembly 146. A motor 148 drives a pully assembly 149 to rotate outer magnetic assembly 146 on bearings and force inner magnetic assembly 144 and mixing member assembly 121 to rotate in response to the rotation of outer magnetic assembly 146. Further insulation of multipurpose chuck apparatus 100 is provided by an insulating ring 150, an insulating plate 152, insulating housing 154, insulating cap 156, insulating member 158, and insulating segment 160, and insulating block 162.

Figure 3:
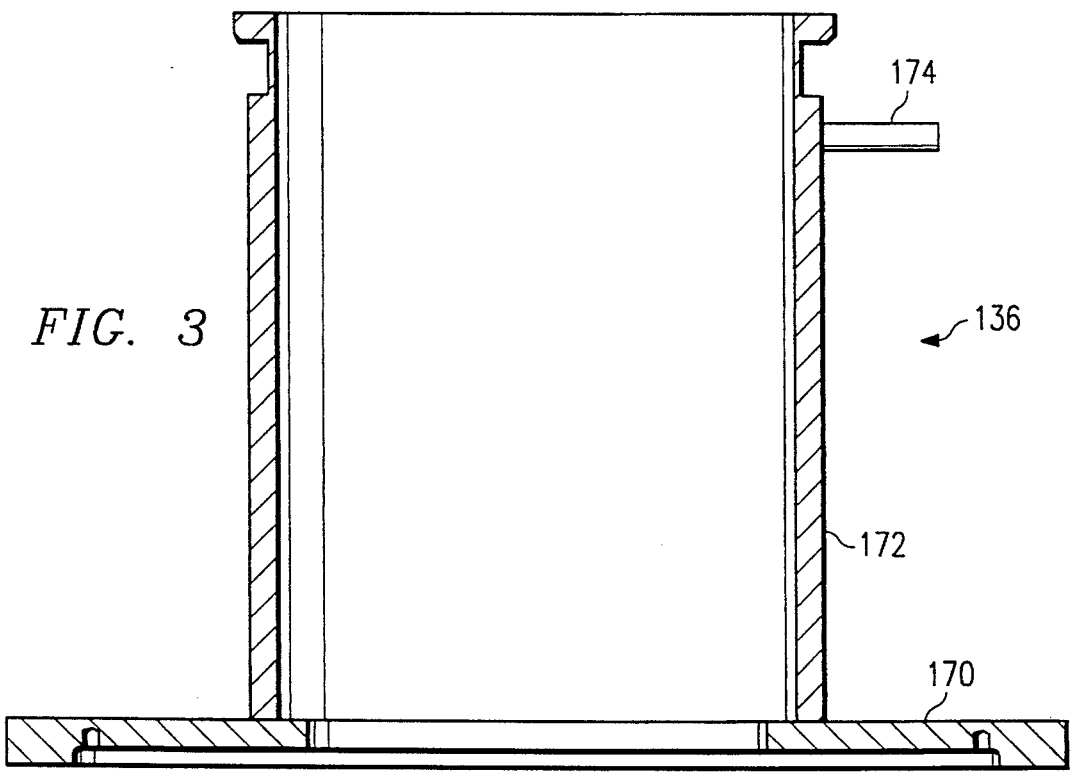
FIG. 3 illustrates a cross-sectional view of the outer metallic housing of a multipurpose chuck apparatus.

FIG. 3 is a cross-sectional view of outer housing 136. Outer housing 136 connects multipurpose chuck apparatus 100 to process chamber 119 at a bottom plate 170. Outer housing 136 encloses components of multipurpose chuck apparatus 100 within a sidewall 172. A pipe 174 is connected to sidewall 172 to allow fluid to be placed within sidewall 172 from inlet 138 for cooling outer housing 136. Outer housing 136 is preferably made of 316L stainless steel and has a thickness of approximately 0.5 inches (1.27 cm).

Figure 4:
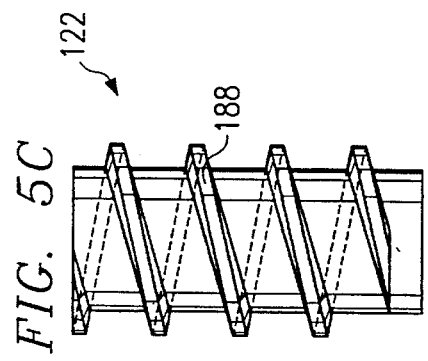
FIG. 4 illustrates a cross-sectional view of the melt chamber of a multipurpose chuck apparatus (along with a top view)

FIG. 4 is a cross-sectional view of melt chamber 112. Melt chamber 112 is enclosed by side melt chamber wall 120 and bottom melt chamber wall 176. Side melt chamber wall 120 is connected to a mounting block 178 for interior connection and structural bracing within multipurpose chuck apparatus 100. Side melt chamber wall 120, bottom melt chamber wall 176, and mounting block 178, all enclosing melt chamber 112, are preferably made of 316L stainless steel and a thickness of approximately 0.1 inches (0.254 cm).

Figure 5A:
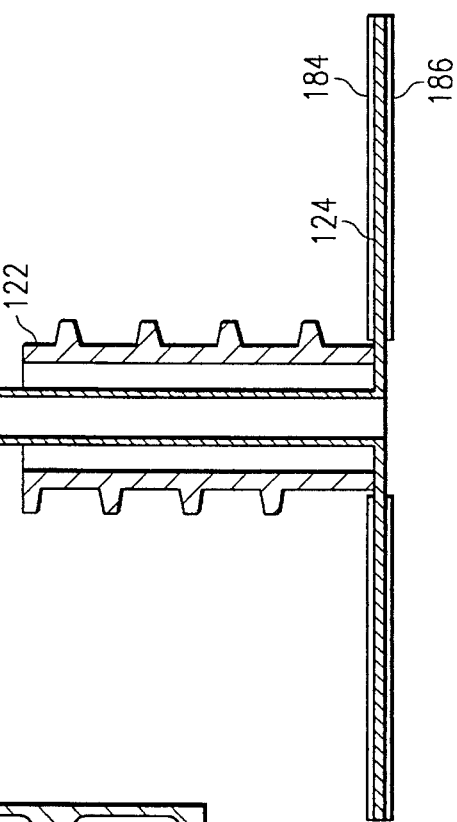
FIGS. 5A–D illustrate cross-sectional and plan views of the melt mixer assembly of the melt chamber of a multipurpose chuck apparatus.
Figure 5C:
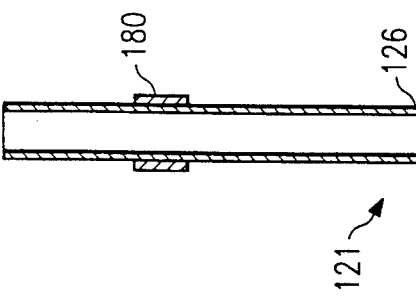
Figure 5B:
Figure 5D:
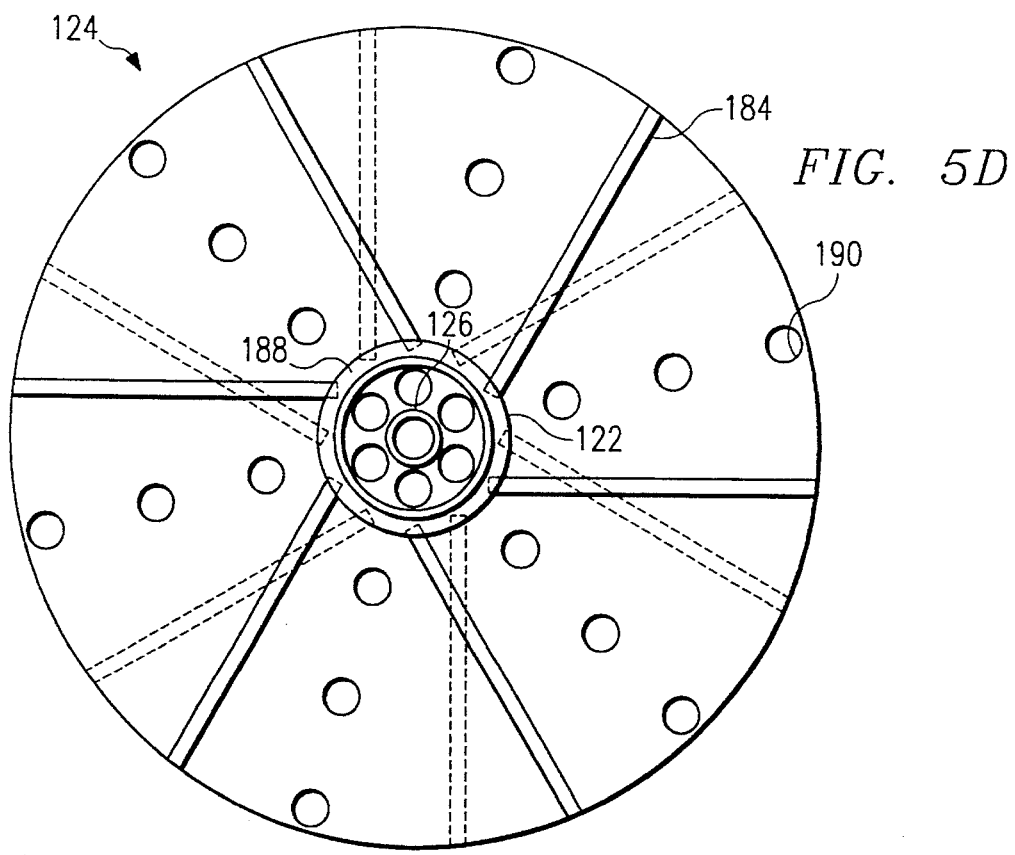

FIGS. 5A–D are cross-sectional and plan views of mixer member assembly 121. FIG. 5A shows a cross-sectional view of mixer member assembly 121. Mixer member assembly 121 includes a connection ring 180 connected to a sidewall 182. Stirring cylinder 122 connects to sidewall 182. Sidewall 182 also connects to stirring disk 124 that includes upper stirring fins 184 and lower stirring fins 186. FIG. 5B is a sectional drawing of connection ring 180. Connection ring 180 attaches mixing member assembly 121 to inner magnetic assembly 144. Rotation of inner magnetic assembly 144 on its bearings forces mixing member assembly 121 to rotate due to the attachment of connector ring 180. FIG. 5C is a plan view of stirring cylinder 122. Stirring cylinder 122 has threads 188 that assist in stirring liquid medium 114 within chamber 112. FIG. 5D is an upper plan view of stirring disk 124. Stirring disk 124 connects to sidewall 182 and rotates upon rotation of inner magnetic assembly 144. Upper stirring fins 184 on stirring disk 124 assist in mixing liquid medium 114 within chamber 112. Stirring fins 186 are located on the bottom side of stirring disk 124. Stirring disk 124 also includes feedthrough holes 190 that allow medium 114 to flow through stirring disk 124 for maximum medium 114 flow. Center tube 126 extends through stirring disk 124. All components of mixer member assembly 121 are preferably made of 316L stainless steel.

Figure 6B:
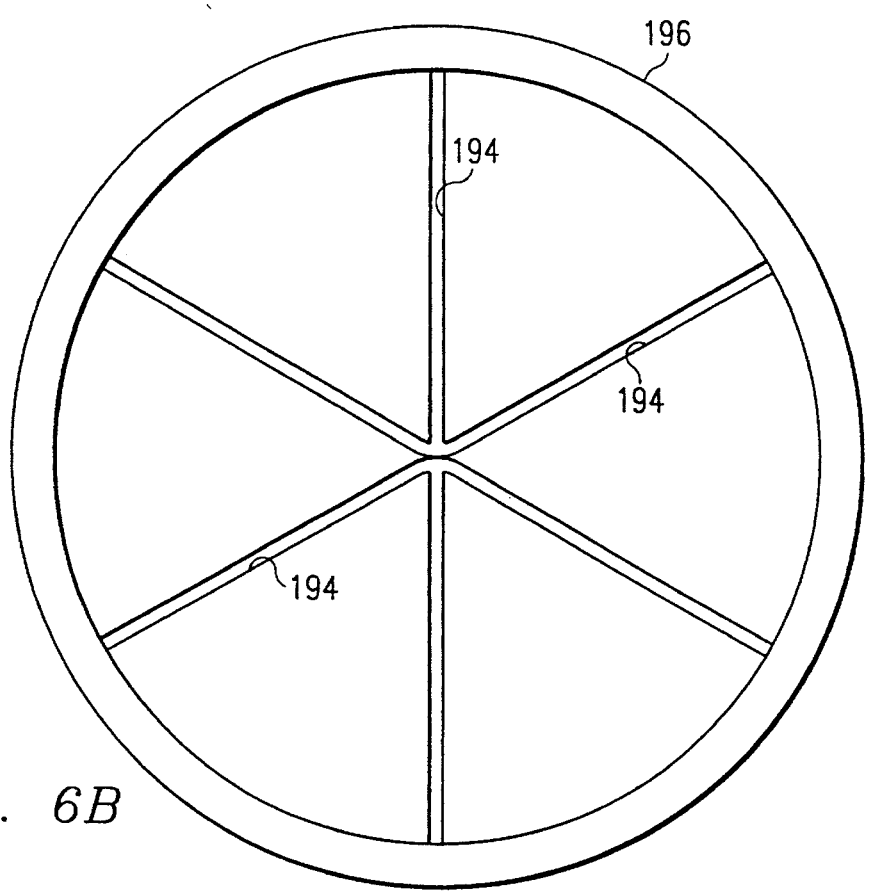
FIGS. 6A–B illustrate cross-sectional and plan views of the center tube and bottom metallic plate of a multipurpose chuck apparatus.
Figure 6A:
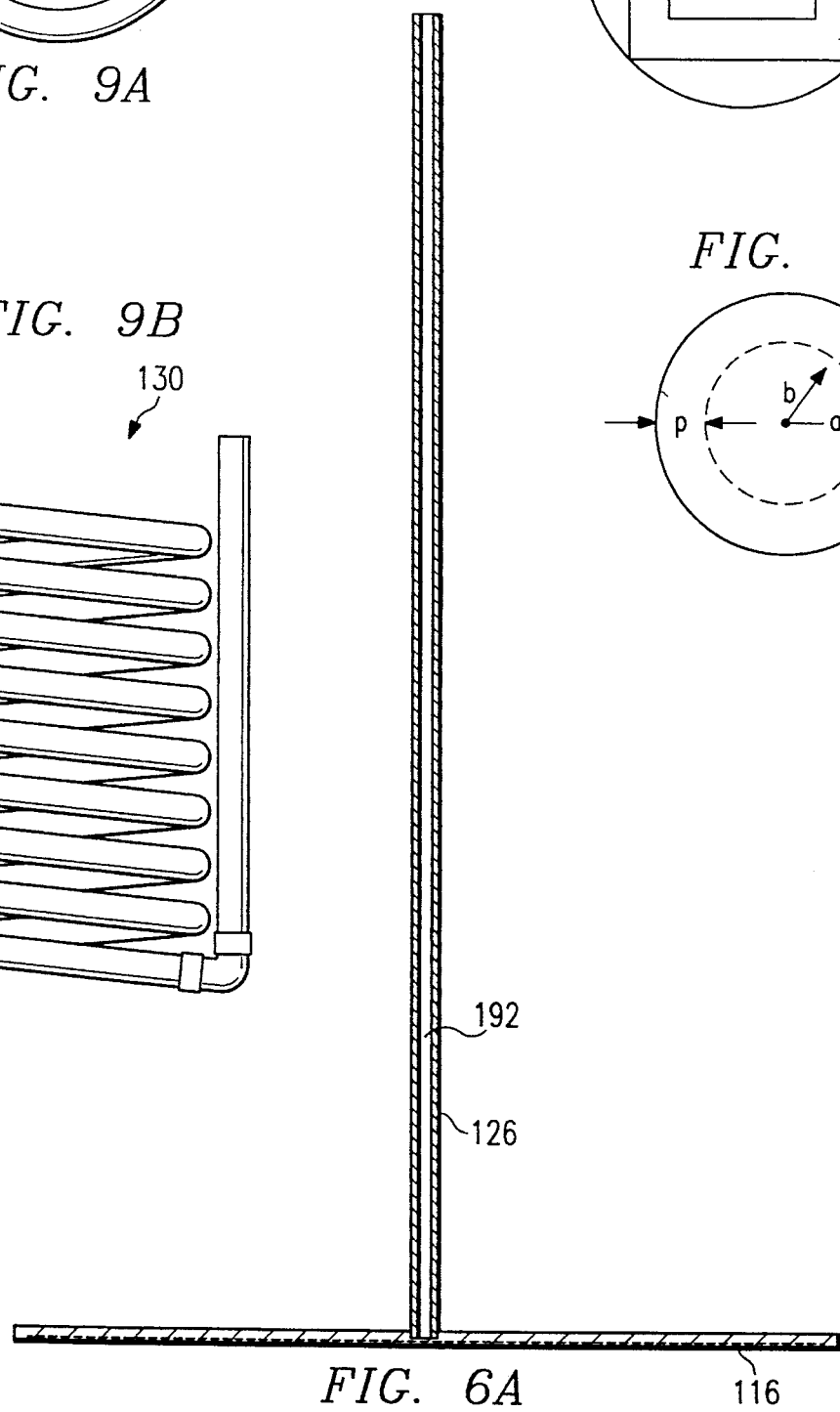

FIGS. 6A–B are cross-sectional and plan views of center tube 126 and bottom chuck plate 115. FIG. 6A shows a cross-sectional view of center tube 126 and bottom chuck plate 115. Center tube 126 provides a passage 192 to allow for helium purge of bottom chuck plate 115 and placement of a thermocouple at the center of bottom chuck plate 115. Center tube 126 and bottom chuck plate 115 are preferably made of 316L stainless steel. FIG. 6B is a plan view of chuck member 115. Chuck member 115 has radial grooves 194 and circular grooves 196 for distributing the purge gas flow.

FIGS. 7A–B are cross-sectional and plan views of upper fluid cooling module 140. FIG. 7A is the cross-sectional view of upper fluid cooling module 140. FIG. 7B is the plan view of upper fluid cooling module 140. Upper fluid cooling module 140 includes a fluid receiving tube 198 that receives fluid for flow within upper fluid cooling module 140 and into tubing 130 and around RF induction heating coil 132. Upper fluid cooling module 140 is preferably made of aluminum.

FIG. 8A–B are cross-sectional and plan views of lower fluid cooling module 142. FIG. 8A is a cross-sectional view of lower fluid cooling module 142. FIG. 8B is the plan view of lower fluid cooling module 142. Lower cooling module 142 includes a fluid outlet pipe 200 for removing fluids from tubing 130 as inserted into upper fluid cooling module 140. Lower cooling module 142 is preferably made of aluminum.

Figure 9A:
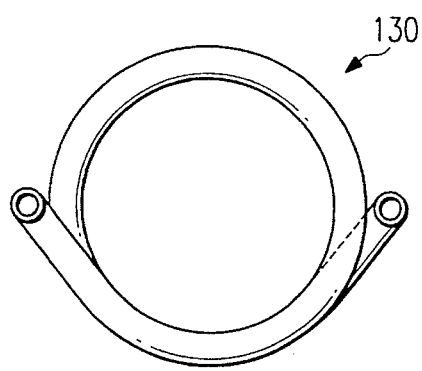
FIGS. 9A–B illustrate cross-sectional and plan views of the RF induction heating coil of a multipurpose chuck apparatus.
Figure 9B:
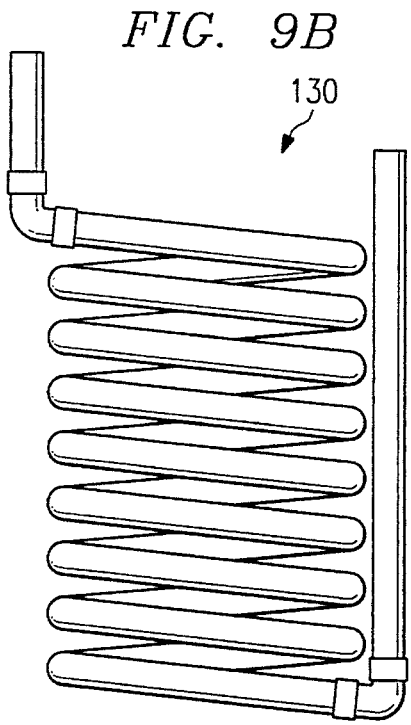

FIGS. 9A–B are side and plan views of tubing 130 containing RF induction heating coil 132. FIG. 9A is the upper plan view of tubing 130 showing a circular configuration. FIG. 9B is a side view of tubing 130. Though shown with eight coil turns, tubing 130 may have any number of coils. Tubing 130 is preferably made of aluminum or copper alloy.

Figure 10:
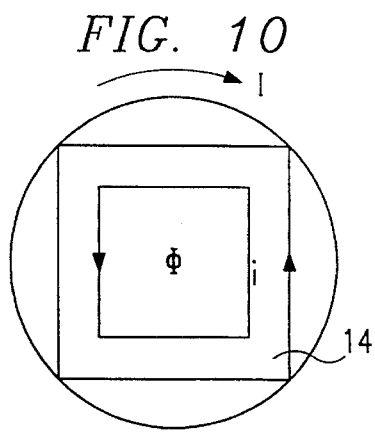
FIG. 10 illustrates a simplified pictorial of current flow within a chamber of the multipurpose chuck apparatus.

During operation of multipurpose chuck apparatus 100, RF induction heating coil 130 activates, placing medium 114 into a molten state and causing eddy current losses within medium 114. As shown in a simplified pictorial of FIG. 10, the primary current in RF induction heating coil 130 generates an alternating magnetic flux that induces a voltage in medium 114, resulting in a secondary current flowing within medium 114 in the opposite direction of the primary RF induction heating coil current. The secondary current, or Focault current, causes the eddy current losses that heat medium 114. Eddy current losses also create intermixing fluid flows in medium 114, resulting in uniform temperature distribution over chuck member 116.

For maximum stirring effect and heating capability with a semiconductor material 118 being a six inch wafer on an eight inch chuck member 116, an RF induction heating power supply RF1 to drive RF induction heating coil 130 may have a power output from 5000–10000 watts at a frequency from 10–50 KHz in order to rapidly reach a steady state temperature of 300° C. to 1000° C. across semiconductor material 118. Frequency selection is determined based on the desired heating of medium 114, the electrical efficiency, and the desired degree of stirring. Typically, the lowest possible frequency of a power supply driving RF induction heating coil 130 is chosen that maximizes the stirring effect of medium 114 and minimizes the direct heating of housing 136, mixing member assembly 121, melt chamber wall 118, and center tube 126. The stirring effect on medium 114 is proportional to the square of the ampere-turns of RF induction heating coil 130.

For enhanced heating at low temperatures, a cylinder may be placed within medium 114. The cylinder may be made of a ferromagnetic material with a high curie point temperature (greater than approximately 1000° C.). Ferromagnetic materials satisfying this criteria include cobalt, iron, or an iron-cobalt alloy.

For optimum high temperature uniform distribution applications through eddy current losses, medium 114 should have a high boiling point (greater than the highest operating temperature for the apparatus such as 1200° C.) a low vapor pressure at the highest operating temperature (less than 1 Torr), a low melting point (below the minimum temperature desired for high temperature processing), and a low electrical resistivity. Metallic materials which fall into the above criteria include tin, indium, and gallium. Other metallic materials may be selected for particular temperature applications. The rate of heating is a function of the electric and magnetic properties of medium 114, the frequency of the power supply for RF induction heating coil 130, and the cylindrical radius of chamber 112. Table I shows the temperature rise during a short period of time for an experimental run of multipurpose chuck apparatus 100 for tin at a frequency of 45 KHZ and a chamber radius of 4 inches.

TABLE I

| TIME (MINUTES) | Frequency at 45 KHZ Medium - Tin TEMPERATURE (DEGREES CELSIUS) |
|---|---|
| 0.0 | 22.4 |
| 0.5 | 95.8 |
| 1.0 | 136.0 |
| 1.5 | 160.0 |
| 2.0 | 183.6 |
| 2.5 | 192.4 |
| 3.0 | 214.0 |
| 3.5 | 275.0 |
| 4.0 | 335.0 |
| 4.5 | 402.0 |
| 5.0 | 451.0 |
| 5.5 | 530.0 |
| 6.0 | 571.0 |
| 6.5 | 604.0 |
| 7.0 | 626.0 |
| 7.5 | 658.0 |
| 8.0 | 670.0 |
| 8.5 | 684.0 |
| 9.0 | 692.0 |
| 9.5 | 697.0 |
| 10.0 | 700.0 |
|  | 707.0 Temperature at Turn off |

Figure 11:
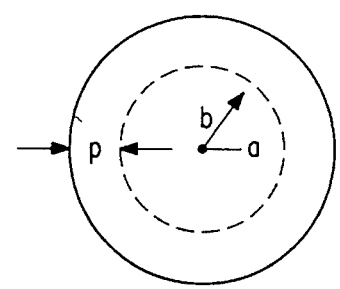
FIG. 11 illustrates a simplified pictorial of the chamber within the multipurpose chuck apparatus.

Though eddy current losses cause intermixing of medium 114, further mixing of medium 114 may be required for complete uniform temperature distribution across chuck member 116. As shown in FIG. 11, the secondary current induced in cylindrical medium 114 flows in a circular path distributed within chamber 112. The secondary current strength decreases radially, resulting in higher temperatures within outer portion of medium 114 closer to RF induction heating coil 130 than a section of medium 114 closer to the center of chamber 112. FIG. 12 is a graph of the heat concentration percentage at different points within a chamber 112 holding medium 114. Depending on the material used for medium 114, the frequency of RF induction heating coil 130, and the dimensions of multipurpose chuck apparatus 100, further stirring of medium 114 may be necessary for complete uniform temperature distribution.

To offset such a possible temperature non-uniformity of medium 114 at the wafer contacting surface 116, a mixing member assembly 121 is placed within chamber 112 to provide further mixing of medium 114. Rotation of outer magnetic assembly 146 forces mixing member assembly 121 to spin within chamber 112 in response to inner magnetic assembly 144. Mixing member assembly 121 employs a stirring disk 124 having stirring fins 184 and 186 that stretch the length of chuck plate 116 to ensure temperature uniformity of medium 114 at the surface of chuck plate 116 and thus a uniform temperature distribution across semiconductor wafer 118. Stirring cylinder 122 attached to mixing member assembly 121 provides mixing of medium 114 within chamber 112 in the vicinity of RF induction heating coil 130. By employing inner and outer magnetic assemblies 144 and 146, mixing member assembly 121 with stirring cylinder 122 and stirring disk 124 do not come in contact with bottom or sidewalls of chamber 112 and avoid application of vibration forces onto semiconductor material 118. This magnetic coupling arrangement also allows application of vacuum to medium 112 to prevent oxidation of liquid medium 114 during high-temperature processing. FIGS. 13A–B depict possible alternative fin configurations of stirring disk 124.

Additional heating may be provided by introducing a fluid, such as an inert gas, into upper chamber 112. The fluid fills the space within chamber 112 above medium 114 at a specified pressure. Additional energy absorbed in the fluid via plasma generation is transferred to medium 114 as heat.

Figure 14:
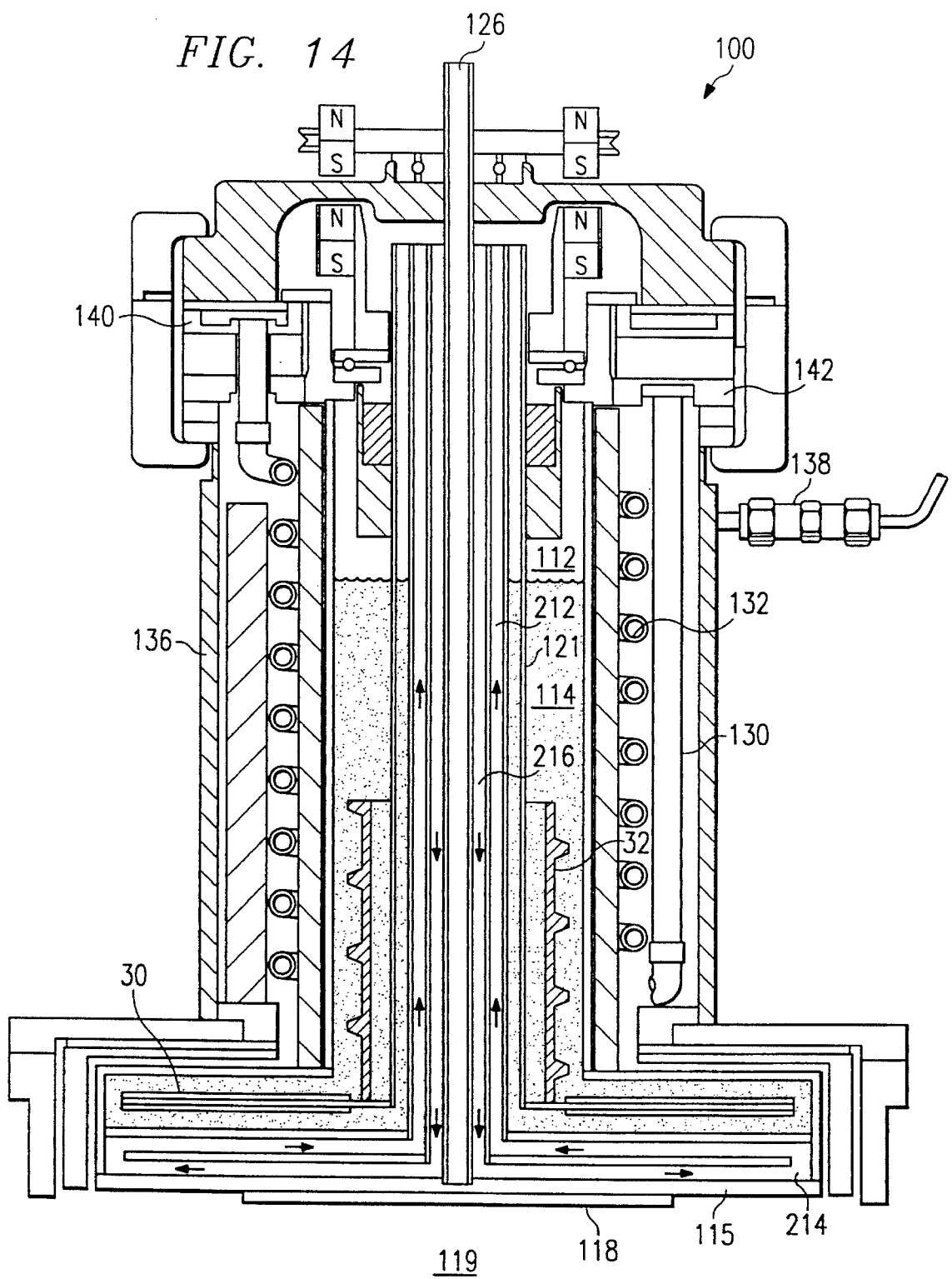
FIG. 14 illustrates a simplified diagram of an alternative embodiment of the multipurpose chuck apparatus.

FIG. 14 shows an alternative embodiment of multipurpose chuck apparatus 100. An inlet cooling tube 210 and an outlet cooling tube 212 surround center tube 126 and lie within mixing member assembly 121. Inlet cooling tube 210 and outlet cooling tube 212 are isolated from medium 114 and mixing member assembly 121. Chuck member 115 has a cavity 214 for receiving cooling fluid from inlet cooling tube 210 for distribution through outlet cooling tube 212. The cooling fluid may be compressed air or compressed liquid-nitrogen-cooled helium.

For low temperature and rapid thermal processing, inlet cooling tube 210 within chamber 112 can send chilled fluid into cavity 214 within chuck member 115 and return the chilled fluid through outlet cooling tube 212 within chamber 112. In this manner, maximum control of the temperature of semiconductor material 118 can be achieved. Multipurpose chuck apparatus 100 can vary the temperature of semiconductor material 118 from cryogenic temperatures of approximately −150° C. to high thermal temperatures of over 1000° C.

FIG. 15 illustrates a possible placement of thermocouple devices within chuck member 115 in order to measure temperature of semiconductor material 118. Thermocouple devices can be placed within chuck member 115 in the vicinity of semiconductor material 118 to monitor and control the temperature across an entire area of semiconductor material 118. A thermocouple feedthrough and helium purge center tube 126 allows for the placement of a thermocouple at the center of semiconductor material 118 and also provides for fluid flow, such as helium, to the back side of semiconductor material 118 for good thermal contact. The isolation of inlet cooling tube 210 and outlet cooling tube 212, that provide chilled fluid to chuck member 115, from medium 114 within chamber 112 ensures effective temperature control of semiconductor material 118.

All insulation layers ensure that the outside shell of multipurpose chuck apparatus 100 remains at room temperature despite the high temperature of medium 114 within chamber 112. Outer housing 136 may also have a cooling inlet 138 for the flowing of water within outer housing 136 to assist in keeping the shell of multipurpose chuck apparatus 100 at room temperature. Further cooling can be provided to RF induction heating coil 132 by flowing water into tubing 130 from upper and lower fluid cooling modules 140 and 142.

Multipurpose chuck apparatus 100 may be used in a wide variety of semiconductor processing techniques including chemical-vapor deposition, thermal anneals and oxidations, epitaxial growth, and plasma etching. For further flexibility, multipurpose chuck apparatus 100 may be constructed with high thermally conductive and electrically resistive nonmagnetic metal, such as stainless steel or molybdenum, for compatibility with magnetron plasma excitation. Semiconductor material 118 may be separated from chuck plate 116 by an intermediate layer, not shown, to prevent possible contamination of semiconductor material 118 by chuck plate 116. Multipurpose chuck apparatus 100 components have high electrical resistivity to ensure that eddy current losses occur within medium 114 and not within the outside walls of multipurpose chuck apparatus 100 in order to avoid direct heating of the outside walls (cylinders 136 and 120).

In summary, a multipurpose chuck apparatus uses a radio frequency induction heating coil to heat a medium within a chamber. The medium consists of a low melting point and high boiling points (low vapor pressure) material with relatively low electrical resistivity, such as tin or indium or bismuth or their alloys. A chuck member separates the medium from a semiconductor wafer that is placed within a process area for appropriate semiconductor processing. The medium heats the semiconductor material through the chuck member for high temperature processing. The RF induction heating coil generates a secondary current within the medium that causes eddy current losses which heat up the medium. The eddy current losses also induce fluid flow within the medium to provide uniform temperature distribution throughout the medium. A mixing member assembly within the chamber further intermixes the medium to ensure complete uniform wafer temperature distribution. Temperature control of the semiconductor material over a wide range may also be achieved through cooling tubes running within the chamber and into the chuck member. The cooling tubes are isolated from the medium to provide chilled fluid such as compressed air or helium to the chuck plate in order to decrease the temperature of the semiconductor material for temperature control in low temperature processing and rapid thermal processing. Fluid cooling of the RF induction heating coil and the outer housing of the multipurpose chuck apparatus, along with appropriate insulation, ensures that the outer shell of the multipurpose chuck apparatus remains at room temperature.

Thus, it is apparent that there has been provided, in accordance with the present invention, a method and apparatus for uniform semiconductor material processing that satisfies the advantages set forth above. Although the preferred embodiment has been described in detail, it should be understood that various changes, substitutions, and alterations can be made herein. For example, though specific materials are mentioned for particular aspects of the chuck apparatus, the chuck apparatus may be made of other materials and employ other elements with similar effectiveness. Other examples are readily ascertainable by one skilled in the art and could be made without departing from the spirit and scope of the present invention as defined by the following claims.

What is claimed is:

1. A multipurpose chuck apparatus for uniform semiconductor material processing, comprising:

a chamber holding a medium;

a chuck member enclosing an end of said chamber, said chuck member separating said medium from a semiconductor material outside said chamber and in contact with said chuck member;

a radio frequency induction heating coil surrounding said chamber for transforming said medium into a high temperature fluid state, said medium heating said semiconductor material through said chuck member.

2. The apparatus of claim 1, further comprising:

a rotating member within said chamber for mixing said medium to provide a uniform temperature distribution across said semiconductor material.

3. The apparatus of claim 2, wherein said rotating member has fins attached thereto in a vicinity of said chuck member to ensure said uniform temperature distribution occurs across said semiconductor material.

4. The apparatus of claim 2, further comprising:

a magnetic rotation device connected to said rotating member for turning said rotating member from outside said chamber.

5. The apparatus of claim 1, further comprising:

a coolant tube within said chamber for providing a cooling fluid within said chuck member.

6. The apparatus of claim 5, wherein said semiconductor material is cooled and heated within a temperature range from approximately minus 150 degrees Celsius to over 1000 degrees Celsius.

7. The apparatus of claim 1, further comprising:

an insulation layer surrounding said radio frequency induction heating coil.

8. An apparatus for uniform temperature distribution across a semiconductor material, comprising:

a chamber holding a metallic medium;

a chuck member enclosing an end of said chamber, said chuck member separating said metallic medium from a semiconductor material in contact with said chuck member and outside said chamber;

a radio frequency induction heating coil surrounding said chamber for producing eddy current losses within said metallic medium, said eddy current losses heating said metallic medium and causing inter-mixing fluid flows within said metallic medium to uniformly distribute temperature throughout said metallic medium, said metallic medium heating said semiconductor material through said chuck member.

9. The apparatus of claim 8, further comprising:

a rotating member within said chamber for stirring said metallic medium in a vicinity of said chuck member to obtain complete uniform temperature distribution of said semiconductor material.

10. The apparatus of claim 9, further comprising:

a magnetic rotation device connected to said rotating member for turning said rotating member from outside said chamber, wherein said rotating member is in contact with said metallic medium and not in contact with interior walls of said chamber.

11. The apparatus of claim 8, further comprising:

a coolant tube within said chamber for introducing a cooling fluid within said chuck member to control a temperature of said semiconductor material.

12. The apparatus of claim 8, wherein said metallic medium is tin.

13. The apparatus of claim 8, wherein said radio frequency induction heating coil operates within a frequency range of 10–50 kilohertz.

14. A method of uniform temperature distribution in a semiconductor fabrication process, comprising the steps of:

placing a metallic medium within a chamber enclosed by a chuck member;

producing eddy current losses within said metallic medium, said eddy current losses heating said metallic medium and causing inter-mixing fluid flows within said metallic medium to uniformly distribute temperature throughout said metallic medium, said metallic medium heating a semiconductor material in contact with said chuck member and outside said chamber.

15. The method of claim 14, further comprising the step of:

stirring said metallic medium to obtain complete uniform temperature distribution within said metallic medium in a vicinity of said chuck member such that said semiconductor material has a same temperature at different points across an entire area of said semiconductor material.

16. The method of claim 14, further comprising the step of:

introducing a cooling fluid within said chuck member to provide temperature control of said semiconductor material, said cooling fluid further providing low-temperature and rapid thermal processing fabrication capabilities.

17. The method of claim 14, further comprising the step of:

introducing a heating fluid within said chamber to fill said chamber above said metallic medium and enhance heating of said metallic medium.

* * * * *